Figure 1:
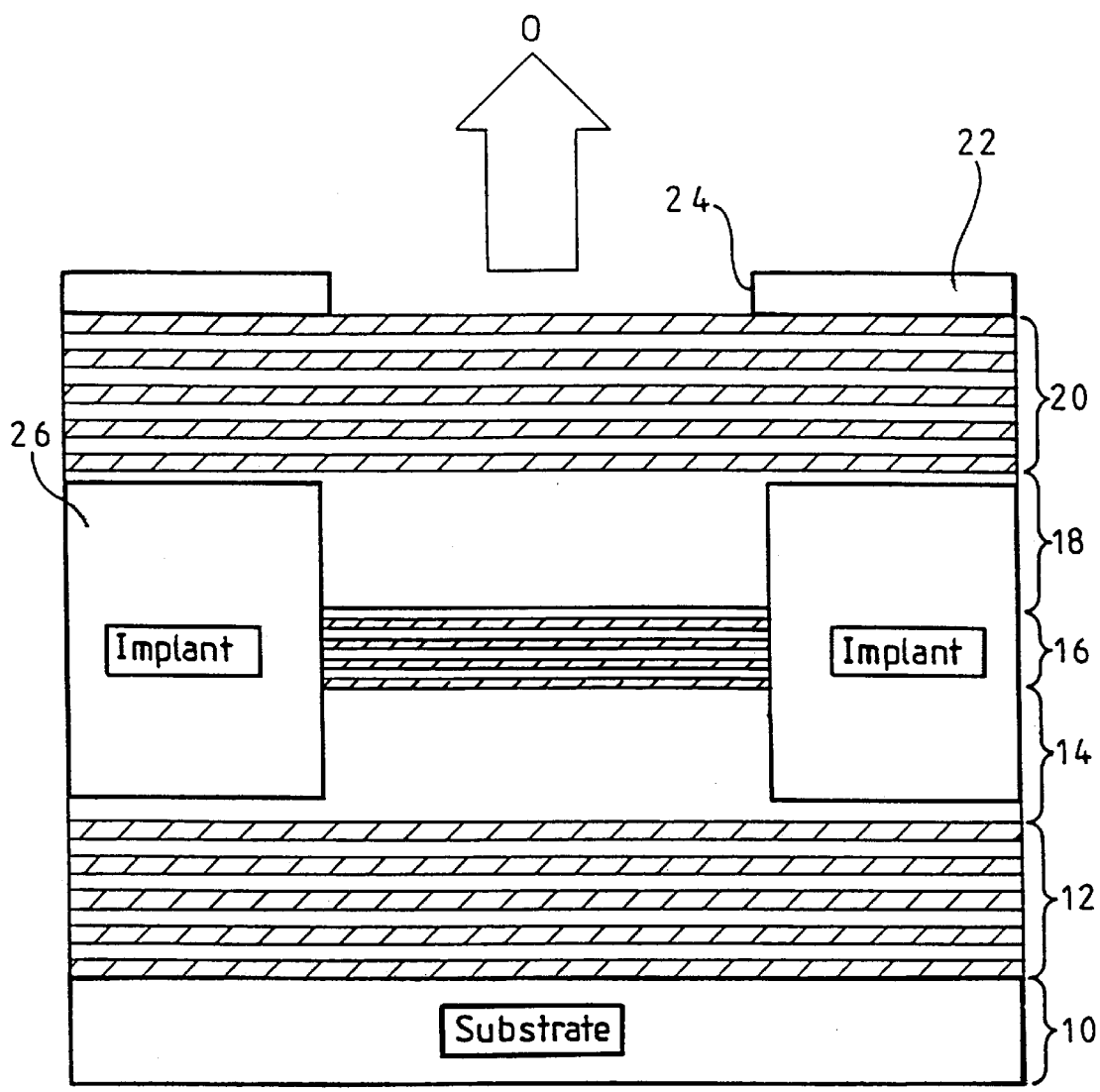

United States Patent [19]
Dawson et al.

[11] Patent Number: 5,812,577
[45] Date of Patent: Sep. 22, 1998

[54] SURFACE-EMITTING LASER

[75] Inventors: Martin David Dawson; Timothy David Bestwick, both of Oxford; Geoffrey Duggan, Oxfordshire, all of United Kingdom

[73] Assignee: Sharp Kabushiki Kaisha, Osaka, Japan

[21] Appl. No.: 557,694

[22] Filed: Nov. 13, 1995

[30]     Foreign Application Priority Data

Nov. 14, 1994 [GB] United Kingdom ............... 9422951

[51] Int. Cl.$^6$ .................................................. H01S 3/19
[52] U.S. Cl. ............................................. 372/46; 372/45
[58] Field of Search ......................... 372/46, 96, 45, 372/99

[56]                References Cited

U.S. PATENT DOCUMENTS

| | | | |
|---|---|---|---|
| 5,256,596 | 10/1993 | Ackley et al. | 438/39 |
| 5,258,316 | 11/1993 | Ackley et al. | 438/42 |
| 5,343,487 | 8/1994 | Scott et al. | 372/46 |

FOREIGN PATENT DOCUMENTS

| | | |
|---|---|---|
| 0579244 | 7/1993 | European Pat. Off. . |
| 2145281 | 3/1985 | United Kingdom . |
| 2280308 | 1/1995 | United Kingdom . |
| 9309582 | 5/1993 | WIPO . |

OTHER PUBLICATIONS

Search Report for UK Appl. 9422951.5, mailed Feb. 6, 1995.
Search Report for UK Appl. 9422951.5, mailed Jul. 4, 1995.
Morgan et al, IEEE Photonics Tech., Letters, vol. 4, No. 4, Apr. 1993, "Transverse Mode Control of Vertical–Cavity Top–Surface–Emitting Lasers ".
Matinaga et al, Appl. Phys. Lett. 62(5), Feb. 1993, pp. 443–445, "Low–Threshold Operation of Hemispherical Microcavity Single . . . ".
Daly et al, Meas. Sci. Technol. 1 (1990) 759–766, "The Manufacture of Microlenses by Melting Photoresist ".
Mersereau et al, SPIE vol. 1751 Miniature and Micro–Optics (1992)/229, "Fabrication and Measurement of Fused Silica Microlens Arryas ".
Iga, Optical and Quantum Elec. 24 (1992) S97–S104, "Surface Emitting Lasers ".
Jewell et al, IEEE Journal of Quantum Elec. vol. 27, No. 6, Jun. 1991, "Vertical–Cavity Surface–Emitting Lasers: Design, Growth, Fabrication, . . . ".
Vakhshoori et al, Appl. Phys. Lett. 62(13), 29 Mar. 1993, pp. 1448–1450, "Top–Surface Emitting Lasers With 1.9 V Threshold Voltage and the . . . ".
Search Report for European Appl. 95308105.6, mailed Feb. 20, 1996.
Schraud. et al, Electronics Letters, 3 Feb. 1994, vol. 30, No. 3, pp. 238–239, "Substrateless Singlemode Vertical Cavity Surface–Emitting . . . ".
Wu et al, Electronics Letters, 14 Oct. 1993, vol. 29, No. 21, pp. 1861–1863,"Singlemode Emission from a Passive–Antiguide—Region . . . ".

*Primary Examiner*—Rodney B. Bovernick
*Assistant Examiner*—Quyen Phan Leung

[57]            ABSTRACT

A surface-emitting laser contains an optical cavity including a multiple quantum well (MQW) active region providing a source of optical emission in use. Top and bottom mirrors are disposed respectively above and below the MQW active region. The MQW active region is profiled so that it has a greater number of quantum wells in a central portion thereof than in a peripheral portion thereof. In alternative embodiments, a current-guiding region is profiled so that it has a first current-guiding portion with a relatively smaller aperture therethrough extending over a central portion of the MQW active region, and a second current-guiding portion with a relatively larger aperture therethrough; and one of the mirrors has a layer structure which, in a central portion of the cross-sectional area of such mirror, is different to that in a peripheral portion of said cross-sectional area.

11 Claims, 4 Drawing Sheets

SURFACE-EMITTING LASER

This invention relates to a surface-emitting laser and, more particularly, a vertical cavity surface emitting laser (VCSEL) having a continuous wave (cw) output. VCSELs are relatively easy to fabricate as linear and two-dimensional arrays and are potentially useful for a wide range of applications including laser printing and scanning, optical interconnects, fibre communications, optical parallel processing, data storage and displays.

Typically, VCSELs are epitaxial semiconductor p-i-n layer structures which emit light in a direction normal to the growth plane. An optical cavity is placed at the centre of a thin (of the order of 1 $\mu$m) Fabry-Perot etalon having top and bottom mirrors typically formed from quarter wave ($\lambda/4$) semiconductor or dielectric distributed Bragg reflectors (DBRs), each having a reflectance (R) in excess of 99%. One or more optically active layers providing a source of optical emission are arranged to be at the antinode(s) of the electric field distribution in the optical cavity, with optical gain characteristics matched to the transmission resonance of the etalon. Upper and lower spacer layers are usually provided respectively above and below the active layer(s) to define the required length of the optical cavity between the top and bottom mirrors.

Many of the applications envisaged for VCSELs rely on a Gaussian characteristic for the output beam profile. Although single longitudinal mode operation is inherent in a VCSEL designed to have only one Fabry-Perot resonance within the mirror stop-band, transverse mode characteristics are less well controlled. Small diameter (<5 $\mu$m), index-guided 'etched pillar'- type VCSELs can exhibit TEM$_{\infty}$ single transverse mode operation, but are difficult to process, and the small active volume, together with surface scattering and diffractive losses, results in low power operation. The more practical, larger diameter (~15–20 $\mu$m) gain-guided VCSELs can operate in a fundamental transverse mode near threshold, but develop higher order transverse mode characteristics above threshold due to a combination of spatial hole burning thermal lensing and self-focusing.

Morgan, R. A. et al in "Transverse Mode Control of Vertical-Cavity Top-Surface-Emitting Lasers", IEEE Photon. Tech. Lett. 4, 374 (1993) disclose VCSELs having a multiple quantum well (MQW) active layer structure, wherein the diameters, w and g respectively, of the central exit window in a top metal ring contact and of the 'gain-guide' aperture (the latter being defined by H$^+$ implantation using a mask) are independently adjusted. The diameter w of the contact window is adjusted to a small value ($\leq 5$ $\mu$m) so as to select single mode emission, whilst the diameter g of the gain-guide aperture is controlled so that it is large enough (typically 15–20 $\mu$m) to maintain process producibility and sufficiently low voltage. However, even when using such an arrangement, the maximum continuous wave single transverse mode power output for VCSELs is limited to 2.6 mW or less.

It is an object of the present invention to obviate or mitigate this disadvantage.

According to a first aspect of the present invention, there is provided a surface-emitting laser comprising an optical cavity including a multiple quantum well (MQW) active region providing a source of optical emission in use; and top and bottom mirrors disposed respectively above and below the MQW active region, wherein the MQW active region is profiled so that it has a greater number of quantum wells in a central portion thereof than in a peripheral portion thereof.

Preferably, the active region is profiled so that the peripheral portion has a single quantum well (SQW).

Preferably also, the number of quantum wells decreases substantially progressively from the central portion through an intermediate portion disposed between the central portion and the peripheral portion, to the peripheral portion.

The central portion is generally confined to the modal area of the active region which produces a single fundamental transverse mode output, and typically has a diameter of not more than about 5 $\mu$m.

Preferably, the active region is one which has been produced by forming an MQW active region having the same number n of quantum wells throughout its cross-sectional area, and then removing (eg by selective etching) at least one of the quantum wells (preferably n–1 quantum wells) in the peripheral portion.

According to a second aspect of the present invention, there is provided a surface-emitting laser comprising an optical cavity including a multiple quantum well (MQW) active region providing a source of optical emission in use; a current-guiding region serving to guide current through the MQW active region; and top and bottom mirrors disposed respectively above and below the active region, wherein the current-guiding region is profiled so that it has a first current-guiding portion with a relatively smaller aperture therethrough extending over a central portion of the MQW active region and a second portion with a relatively larger aperture therethrough.

The first and second portions of the current-guiding region are preferably ones which have been formed by ion-implantation to increase electrical resistance. The ions may be any suitable ions having regard to the material being implanted. For example, for a GaAs material, the ion implanted may be H$^+$, although for other materials it may be O$^{2-}$.

Preferably, the first and second current-guiding portions comprise ion-implanted portions of different depths. The current-guiding region may extend for at least part of the depth of the active region, or it may extend over at least part of the depth of a spacer region in the optical cavity, or it may extend for at least part of the depth of the spacer region and at least part of the depth of the active region.

According to a third aspect of the present invention, there is provided a surface-emitting laser comprising an optical cavity including a multiple quantum well (MQW) active region providing a source of optical emission in use; and top and bottom mirrors disposed respectively above and below the MQW active region; one of the mirrors (preferably that which defines an output mirror of the laser) having a layer structure which, in a central portion of the cross-sectional area of such mirror, is different to that in a peripheral portion of said cross-sectional area.

In one embodiment of said third aspect of the present invention, the layer structure of said one of said mirrors has a greater number of layers in said central portion than in said peripheral portion.

Figure 2:
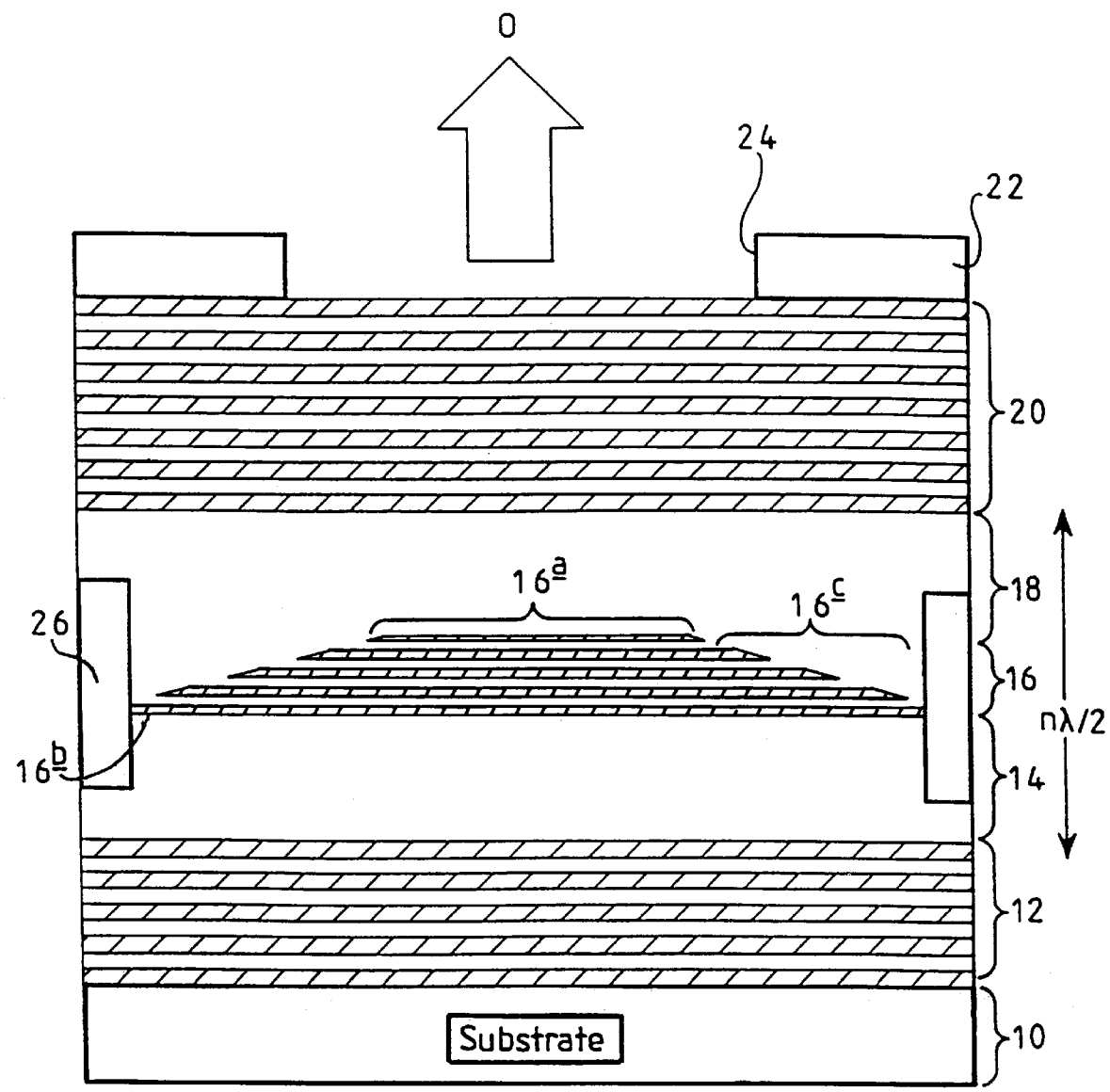
Figure 3:
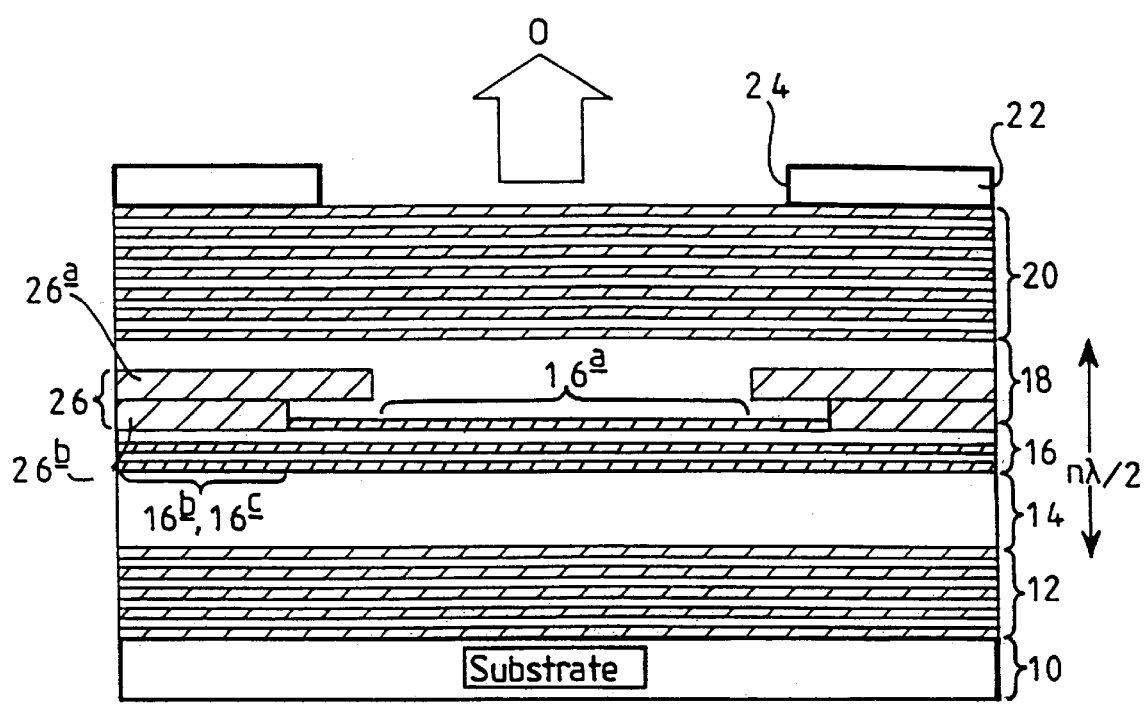
Figure 4:
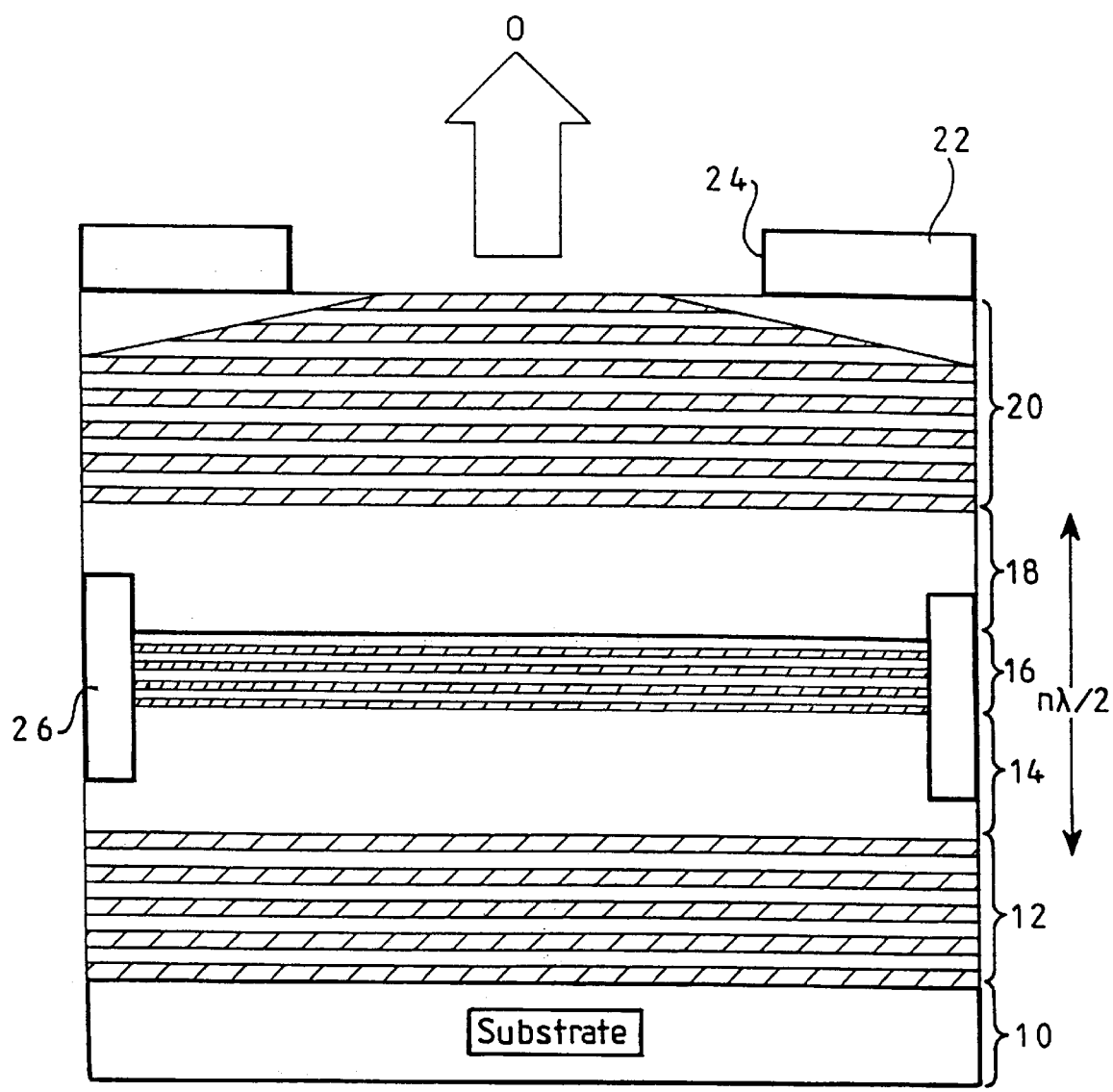

The first, second and third aspects of the present invention will now be described in further detail with reference to the accompanying drawings, in which:

FIG. 1 is a schematic diagram of a previously proposed VCSEL having a current-guided region, FIG. 2 is a schematic diagram of an embodiment of VCSEL according to said first aspect of the present invention, FIG. 3 is a schematic diagram of an embodiment of VCSEL according to said second aspect of the present invention, and FIG. 4 is a schematic diagram of an embodiment of VCSEL according to said third aspect of the present invention.

Referring now to FIG. 1, the previously proposed VCSEL comprises a semiconductor substrate 10 upon which have been successively formed a bottom DBR mirror 12, a lower semiconductor spacer region 14, an MQW active region 16, an upper semiconductor spacer region 18, a top DBR mirror 20 and an upper metal ring electrical contact 22 having a central exit window 24 therethrough. The top mirror 20 forms the output mirror of the VCSEL. The DBR mirrors 12 and 20 are formed in a manner known per se of a multiplicity of pairs of quarter wave mirror layers of high and low refractive index, typically 30 or more pairs of mirror layers. A lower electrical contact (not shown) is provided on the underside of the substrate 10. The optical output from the VCSEL is in the direction of arrow O.

The VCSEL has an annular current-guiding region 26 formed by radially inward $H^+$ ion implantation to provide a gain-guided structure. The annular region 26 typically has an inner diameter of 15–20 $\mu$m which represents the gain guide diameter. In FIG. 1, the region 26 is illustrated as having sharp, well-defined inner peripheral edges with a cylindrical inner surface. However, it is to be appreciated that these parts will in fact be slightly curved because of the inherent nature of the ion-implantation process used to form the region 26 (the same applies to the corresponding parts in FIGS. 2 to 4). In the embodiment illustrated in FIG. 1, the diameter of the exit window 24 is about the same as the inner diameter of the current-guiding region 26. The disadvantage of such a structure is that, above threshold, a number of effects including thermal lensing, spatial hole burning, self-focussing and non-uniform current injection lead to the appearance of higher-order transverse modes with accompanying "kinks" in the light output vs. current characteristic of the VCSEL (see Morgan, R. A.—supra). In order to mitigate this disadvantage, Morgan, R. A. et al propose reducing the diameter of the exit window 24 to $\leq 5$ $\mu$m in order to limit lasing to $TEM_{\infty}$ mode. However, even with such window diameter reduction, the maximum continuous wave (cw) single transverse mode power output for the VCSEL is still limited to 2.6 mW or less.

Referring now to FIG. 2, the embodiment of VCSEL according to said first aspect of the present invention has a similar structure to that of FIG. 1 and similar parts are accorded the same reference numerals. The optical cavity of the VCSEL has a length of $n\lambda/2$ (where $\lambda$ is the wavelength of the emitted light and n is an integer) and is defined by the active region 16 and the upper and lower spacer regions 18 and 14. In this embodiment, the MQW active region 16 is formed by first epitaxially depositing layers of several (5 in this embodiment) quantum wells on the lower spacer region 14 and then radially etching such layer structure so that the active region 16 tapers from a full complement of quantum wells in the central portion 16a to a single well ~5 $\mu$m away at the peripheral portion 16b of the region 16, with the reduction in the number of quantum wells reducing substantially progressively in an annular intermediate portion 16c between the portions 16a and 16b. This structure is overgrown with the upper spacer region 18 and then the top DBR mirror 20.

Etching of the active region 16 to produce the required radial profiling thereof may be effected by wet chemical etching or by dry etching. Dry etching may be performed using a micro-lens fabrication process wherein melting of a photoresist disk is effected to generate a lens-like mask for subsequent dry etching (see, for example, (i) Matinaga, F. M. et al, "Low-threshold operation of hemispherical microcavity single quantum-well lasers at 4 K", Appl. Phys. Lett. 62, 443 (1993); (ii) Daly, D. et al "The manufacture of microlenses by melting photoresist", Meas. Sci. Technol. 1 (1990) 759–766; and (iii) Mersereau, K. et al, "Fabrication and measurement of fused silica microlens arrays", SPIE Vol. 1751, Miniature and Micro-Optics (1992), 229–233). By using an etching procedure in which the lens-like mask and the active region are etched away at the same rate the profile of the lens-like mask can be etched into the active region.

The optical gain in a quantum well saturates with increasing injected current because of the step-like form of the density of electronic states. Therefore, although a single quantum well (SQW) will reach transparency at the lowest Injected current density, the total gain available is higher with multiple quantum wells (MQW). By radially etching the structure from an MQW at mode centre to an SQW at the peripheral edge, it is ensured that, under suitably high current injection conditions, the total gain available varies radially, to aid in the maintenance of a fundamental transverse mode. With this structure, it is considered possible to achieve an improved continuous wave (cw) single transverse mode power output from the VCSEL.

A similar effect can be achieved by the structure illustrated in the embodiment of FIG. 3 where, instead of radially profiling the active region, control of the location and depth of ion-implantation is effected to produce a specifically shaped current-guide region 26 defining a particular current pattern in use. Radial control of the dose of the ion implantation process is carried out in two steps to different radial depths so that the periphery of the current-guiding region 26 is defined by a first, annular current-guiding portion 26a having a smaller internal diameter (~5 $\mu$m) and an adjacent, second, annular current-guiding portion 26b having a larger internal diameter (~10 $\mu$m). In this embodiment, the portion 26a is formed in the upper spacer region 18, whilst the portion 26b is formed partly in the upper spacer region 18 and partly in the active region 16.

The effect of portion 26a is to cause current flow to be channelled mainly through the central portion 16a of the active region 16, whilst the portion 26b permits sufficient current to flow through the intermediate and peripheral regions 16c and 16b for lasing to take place there. In FIG. 3, one of the quantum wells of the active region 16 is shown as being delimited by the inner periphery of the current-guiding portion 26b. Structurally speaking, the active region 16 extends outwardly through the current-guiding region 26b which includes a part of the active region 16 which has been ion-implanted to increase the electrical resistance. Ion implantation at the dose rates necessary to impart the required degree of electrical resistance will not materially affect the optical transparency of the active region 16. However, because of the increased electrical resistance thereof, the portion 26b is not considered functionally to be part of the active region 16. This is because, at the power input level at which the VCSEL is operated, the current flow through such portion 26b is below the threshold current necessary for lasing to occur in such portion.

As shown in FIG. 3, the current-guiding portions 26a and 26b are mutually displaced in the emission direction O, with the portion 26a lying nearer to the window 24 so that a funnel structure opening downwardly, ie away from the window 24, is defined. However, an upwardly opening funnel structure may be provided by forming the current-guiding portion 26b nearer to the window 24 than the portion 26a.

VCSELs only have a small gain per pass because the active layer in such lasers is very thin. This means that the mirror reflectivities have to be very high (>99%). To achieve this, it is the usual practice to form the DBR mirrors from 30 or more quarter wave mirror pairs, as noted above. According to the third aspect of the present invention (see FIG. 4), the layer structure of the output DBR mirror 20 is profiled to produce a significant radial loss either instead of or in addition to the profiling described hereinabove in relation to FIG. 2 or 3. This profiling of the mirror 20 may be effected by removing (eg etching) as few as one or two mirror pairs a few μm from the mode centre. Thus, the mirror layer structure has a different structure in its central portion to that at its peripheral portion. This may be done by the micro-lens type dry-etching process referred to above in relation to FIG. 2. In the embodiment of FIG. 4, etching is effected in a way such as to promote $TEM_\infty$ single transverse mode operation, by reducing the reflectivity of those peripheral portions of the mirror 20 at which reflection of other transverse modes is prevalent. The result of this is to reduce stimulation of emission of such unwanted transverse modes.

It is also within the scope of this third aspect of the present invention to arrange the radial loss profiling of the mirror 20 so as to produce different mode shapes. For example, etching one or two of the mirror pairs at the mode centre may be effected to form a "doughnut"-type transverse mode profile.

What is claimed is:

1. A surface-emitting laser comprising an optical cavity including a multiple quantum well (MQW) active region providing a source of optical emission in use; and top and bottom mirrors disposed respectively above and below the MQW active region, wherein a functionally active portion of the MQW active region is profiled so that it has a substantially greater number of quantum wells and promotes substantially higher gain in a central portion thereof than in a general peripheral portion thereof.

2. A laser as claimed in claim 1, wherein the active region is profiled so that the peripheral portion has a single quantum well.

3. A laser as claimed in claim 1, wherein the number of quantum wells decreases substantially progressively from the central portion through an intermediate portion disposed between the central portion and the peripheral portion, to the peripheral portion.

4. A laser as claimed in claim 1, wherein the central portion is generally confined to the modal area of the active region which produces a single fundamental transverse mode output.

5. A laser as claimed in claim 4, wherein the central portion of the active region has a diameter of not more than about 5 μm.

6. A laser as claimed in claim 1, wherein the active region is one which has been produced by forming an MQW active region having the same number n of quantum wells throughout its cross-sectional area, and then removing at least one of the quantum wells in the peripheral portion.

7. A laser as claimed in claim 1, wherein the active region profile is shaped such that a total gain of the laser substantially varies from the central portion towards the peripheral portion.

8. A laser as claimed in claim 7, wherein the variation of the total gain aids in maintaining a fundamental transverse mode of the laser.

9. A surface-emitting laser comprising an optical cavity including a multiple quantum well (MQW) active region providing a source of optical emission in use; a current-guiding region serving to guide current through the MQW active region; and top and bottom mirrors disposed respectively above and below the active region, where the current-guiding region is profiled so that it has a first current-guiding portion with a substantially smaller aperture therethrough extending over a central portion of the MQW active region and a second current-guiding portion in the active region with a substantially larger aperture therethrough.

10. A laser as claimed in claim 9, wherein the first and second current-guiding portions of the current-guiding region are ones which have been formed by ion-implantation to increase electrical resistance.

11. A laser as claimed in claim 9, wherein the first and second current-guiding portions comprise ion-implanted portions of different depths.

* * * * *